Figure 1:
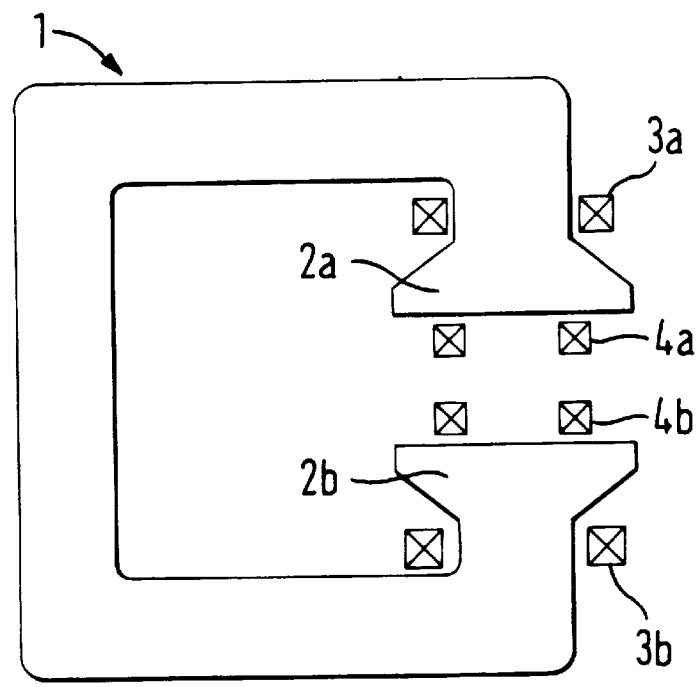

United States Patent
Young

[11] Patent Number: 6,111,410
[45] Date of Patent: Aug. 29, 2000

[54] NUCLEAR MAGNETIC RESONANCE IMAGING APPARATUS

[75] Inventor: Ian Robert Young, Wiltshire, United Kingdom

[73] Assignee: Picker International, Inc., Cleveland, Ohio

[21] Appl. No.: 08/975,815

[22] Filed: Nov. 21, 1997

[30] Foreign Application Priority Data

Nov. 28, 1996 [GB] United Kingdom .................. 9624722

[51] Int. Cl.[7] ........................................... G01V 3/00
[52] U.S. Cl. ............................................ 324/309; 324/318
[58] Field of Search .................................. 324/309, 300, 324/307, 318, 319, 320; 128/653

[56] References Cited

U.S. PATENT DOCUMENTS 4,906,931  3/1990  Sepponen ................................ 324/309
4,985,678  1/1991  Gangarosa, et al. ................... 324/309
5,555,251  9/1996  Kinanen ................................ 324/309

FOREIGN PATENT DOCUMENTS 0465068  1/1992  European Pat. Off. .
WO9114948 10/1991  WIPO .

*Primary Examiner*—Christine K. Oda
*Assistant Examiner*—Brij B. Shrivastav
*Attorney, Agent, or Firm*—Timothy B. Gurin; John J. Fry; Eugene E. Clair

[57] ABSTRACT

A magnet having a yoke and a pair of poles coupled to the yoke in a spaced apart relationship includes a pair of energization coils in proximity to each of the poles for creating a magnetic field of a desired strength. A pair of prepolarization coils are also disposed in proximity to each of the poles to vary the strength of the magnetic field during a nuclear magnetic resonance prepolarization procedure. In order to minimize the amount of eddy currents introduced to the yoke during the prepolarization procedure the poles are comprised of magnetically effective and substantially non-electrically conductive material. Magnetically effective material includes material having a low hystresis. To further reduce the amount of eddy currents introduced to yoke, a flux is created having a sense substantially opposite of that produced by the energization coil. Such opposing flux may be produced by the prepolarization coils and/or by a shield winding placed in proximity of the poles for that purpose.

21 Claims, 1 Drawing Sheet

NUCLEAR MAGNETIC RESONANCE IMAGING APPARATUS

The present invention relates to Nuclear Magnetic Resonance Imaging Apparatus (known as MRI) apparatus.

In magnetic resonance methods and apparatus a static magnetic field is applied to the body under investigation, i.e. the patient, in order to define an equilibrium axis of magnetic alignment in the region of the body being examined. A radio frequency field is then applied to the region being examined in a direction orthogonal to the static magnetic field direction in order to excite magnetic resonance in the region, the resulting radio frequency signals being detected and processed. The exciting radio frequency field is applied and resulting signals are detected by radio frequency coils placed adjacent the body.

The present invention is more particularly concerned with the means for generating the main magnetic field. Such means can comprise a permanent or an electro-magnet.

The present invention is concerned with the construction and composition of a permanent magnet for this purpose and more particularly with providing an iron-yoked magnet which will be suitable, or more suitable, for carrying out a known NMR procedure known as prepolarisation.

Prepolarisation is an NMR method by which an object to be studied is placed in a magnetic field with other facilities as is conventional for NMR experiments. Additionally, however, prior to the experiment, the field is changed for a significant fraction of $T_1$ of the object (in the field then applied) so that its magnetisation then develops in accordance with a relationship of the kind $$B_0^1\left(1 - \exp\left(-\frac{t}{T_1}\right)\right)$$

where t is the time for which the object has been in the changed field $B_0^1$, where $B_0^1$ is the vector sum of the normal and incorrectly applied fields.

Typically the changed field is substantially greater than that of the actual experiment, and, as long as the transition from the high field can be made fast enough ($<<T_1$) the magnetisation available for the experiment is largely that available as a result of the field change.

The method is particularly relevant to experiments where, for one reason or another, the experiment has to be conducted in a low field, and is applicable to imaging as well as other NMR investigations.

In some iron-yoked magnets there are additional problems with the process as an increase in the flux in the imaging volume is produced, particularly if, as is most advantageous, the additional prepolarising field is parallel to the main field which results in flux changes (increases) in the iron. Any transient flux changes in the iron structures generates eddy currents and slows the process so reducing its effectiveness.

The present invention is concerning with overcoming or reducing these problems associated with the use of an iron-yoked magnet for carrying out the prepolarising procedure.

According to the present invention an iron-yoked field magnet, suitable for use in a nuclear magnetic resonance prepolarisation procedure, having its main body or yoke made of iron and having main energisation coils and prepolarisation coils mounted at or near its poles, is characterised by having its pole only made of a non-electrically conducting but magnetically effective material.

According to one aspect of the present invention the said material comprises a powered iron and epoxy resin matrix.

According to a second aspect of the present invention the iron-yoked magnet is provided with shield windings positioned and operable to generate flux in an opposite sense to the flux generated by said prepolarisation coils in order to prevent flux from entering the iron part of the field magnet.

Figure 2:
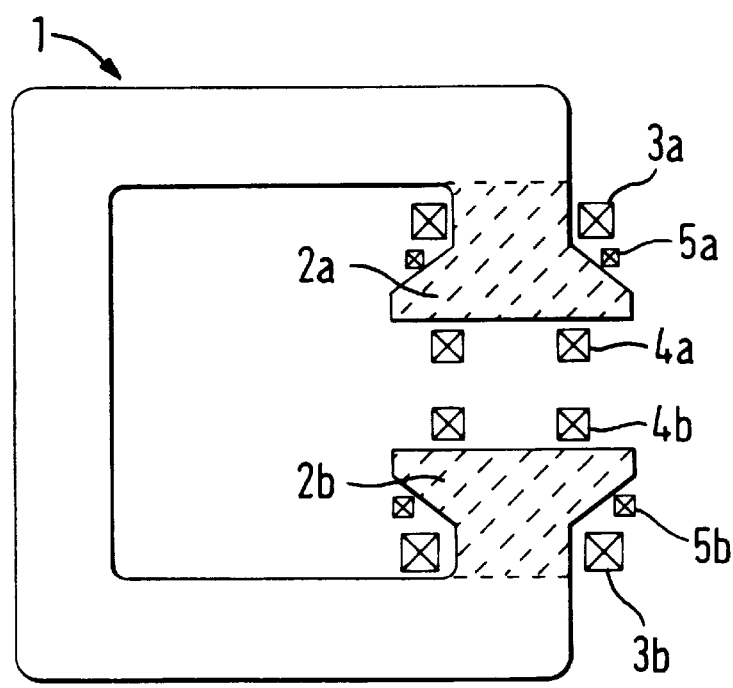

How the invention made be carried out will now be described by way of example only with reference to the accompanying drawings in which:

FIG. 1 is a schematic side elevational view of a known construction of iron-yoked magnet suitable for use in MR apparatus; and FIG. 2 is of use similar to FIG. 1 showing one embodiment of the present invention.

FIG. 1

An iron-yoked magnet 1 has poles 2a, 2b which are provided with energisation coils 3a, 3b respectively.

Additional coils 4a, 4b are provided on the faces of the poles 2a, 2b respectively, the coils 4a, 4b being designed to produce, when energised, large quantities of flux for the purpose of the known procedure of prepolarisation, as referred to earlier.

The large flux produced by the prepolarisation coils 4a, 4b tends to produce eddy currents in the iron of the poles 2a, 2b which eddy currents adversely affect the experiment.

Other arrangements could be employed instead of the coils 3 to create the magnetic field and the coils 4 to produce the prepolarisation.

The present invention is concerned with overcoming or at least reducing these problems and one embodiment of the invention is shown in FIG. 2, the same reference numerals being used to designate elements which correspond to those in FIG. 1.

In order to reduce the aforementioned eddy currents to a level where they will not cause the problem referred to earlier, the poles 2a, 2b of the magnet are not made solely of iron, as is the remainder of the magnet, but instead are made of a non-conducting but magnetically effective material.

In this embodiment this material is powdered iron embedded in an epoxy matrix which tends to give the best all round performance. The matrix could comprise other materials. The requirements are for good magnetic saturation ($B_{SAT}$), low hysteresis loss and very low conductivity. An alternative would be to have bundles of wire, or other metal matrix, in the epoxy resin.

Whilst it would be possible to manufacture the whole yoke of such a composite material this would have the disadvantages of excessive cost, poor mechanical strength and difficulty of manufacture.

The solution of the present invention is therefore to only manufacture only the pole pieces of the magnet from this composite material. However, with such construction there may still be unwanted stray flux entering the main iron body of the yoke of the magnet. Therefore, in order to deal with this possibility a further pair of flux shield windings 5a, 5b can be provided. These shield windings are designed and energised to generate flux in an opposite sense from that generated by the coils 4a, 4b.

In the design illustrated, the longer the dimension 'x' (i.e. the larger the composite pole pieces are) the less it is required to have the shield windings 5a, 5b. Thus if the dimension 'x' is made large enough then the shield windings 5a, 5b can be dispensed with.

In a preferred arrangement the shield windings 5a, 5b are dispensed with and instead the windings 3a, 3b and the windings 4a, 4b are energised in such a way that they in effect oppose one another so that the flux in the iron beyond the windings 3a, 3b is held substantially constant thereby alleviating eddy current effects

What is claimed is:

1. An apparatus adapted for use in a nuclear magnetic resonance excitation and detection procedure, the apparatus comprising:

a yoke;

a pair of poles supported by the yoke in a spaced apart relationship;

a main energization coil disposed in proximity to each of the poles;

a prepolarization coil disposed in proximity to each of the poles; and wherein each of the poles is comprised of a low hysteresis, high permeability and substantially non-electrically conducting material.

2. The apparatus of claim 1, wherein the yoke is comprised of iron.

3. The apparatus of claim 1, wherein said material is a powdered iron embedded in an epoxy resin.

4. The apparatus of claim 1, wherein said material is metal matrix disposed in an epoxy resin.

5. The apparatus of claim 4, wherein the metal matrix is a bundle of wire.

6. The apparatus of claim 1, wherein a flux generated by the main energization coil is substantially opposite in sense to a flux generated by the prepolarization coil.

7. The apparatus of claim 1, further comprising a shield winding positioned in relationship to the prepolarization coil such that a flux generated by said shield winding is substantially opposite in sense to a flux generated by said prepolarization coil so as to minimize transference of flux to the yoke.

8. A apparatus adapted for use with a nuclear magnetic resonance excitation and detection procedure, said apparatus comprising:

a magnet including a yoke and a pair of poles coupled together by the yoke in a spaced apart relationship;

a main energization coil disposed proximate each of the poles;

a prepolarization coil disposed proximate each of the poles; and means for reducing eddy currents transferred to the yoke from the prepolarization coil.

9. The apparatus of claim 8, wherein said means is a shield winding positioned in relationship to the prepolarization coil such that a flux generated by said shield winding is substantially opposite in sense to a flux generated by said prepolarization coil.

10. The apparatus of claim 9, wherein the pair of poles is comprised of a highly resistive and magnetically effective material.

11. The apparatus of claim 10, wherein the yoke is comprised of iron.

12. The apparatus of claim 8, wherein a flux generated by the main energization coil is substantially opposite in sense to a flux generated by the prepolarization coil.

13. An apparatus for use in a nuclear magnetic resonance excitation and detection procedure comprising:

a magnet having a pair of poles disposed in an opposed relationship, each of the poles comprised of a material having low conductivity, low hysteresis and high permeability;

a main energization coil disposed proximate each of the poles; and a prepolarization coil disposed proximate each of the poles.

14. The magnetic resonance imaging apparatus of claim 13, wherein a flux generated by the main energization coil is substantially opposite in sense to a flux generated by the prepolarization coil.

15. The magnetic resonance imaging apparatus of claim 13, further comprising a shield winding positioned in relationship to the prepolarization coil such that a flux generated by said shield winding is substantially opposite in sense to a flux generated by said prepolarization coil.

16. A method of reducing eddy currents in a magnet during a nuclear magnetic resonance prepolarization procedure, the method comprising the step of:

creating a flux substantially opposite in sense to a flux generated by a main energization coil of the magnet during the nuclear magnetic resonance prepolarization procedure.

17. The method of claim 16 wherein a prepolarization coil creates the flux substantially opposite in sense to the flux generated by the main energization coil of the magnet.

18. The method of claim 16, wherein a shield winding creates the flux substantially opposite in sense to the flux generated by the main energization coil of the magnet.

19. The method of claim 16, wherein the magnet includes a pair of poles comprised of a material having low conductivity, low hystresis and good magnetic saturation.

20. A method of reducing eddy currents in a magnet during a nuclear magnetic resonance prepolarization procedure, the method comprising the steps of:

energizing a main energization coil of the magnet so as to produce a main magnetic field of a desired strength in gap defined between a pair of poles of the magnet;

energizing a prepolarization coil of the magnet so as to alter a strength of the main magnetic field during the nuclear magnetic resonance prepolarization procedure; and wherein each of the poles is comprised of a material having low hystresis and low conductivity.

21. An apparatus adapted for use in a nuclear magnetic resonance excitation and detection procedure, the apparatus comprising:

a yoke;

a pair of poles supported by the yoke in a spaced apart relationship;

a main energization coil disposed in proximity to each of the poles;

a prepolarization coil disposed in proximity to each of the poles;

a shield winding positioned in relationship to the prepolarization coil such that a flux generated by said shield winding is substantially opposite in sense to a flux generated by said prepolarization coil so as to minimize the transference of flux to the yoke; and wherein each of the poles is comprised of a magnetically effective and substantially non-electrically conducting material.

* * * * *